United States Patent
Viehmann et al.

(10) Patent No.: US 6,801,471 B2
(45) Date of Patent: Oct. 5, 2004

(54) FUSE CONCEPT AND METHOD OF OPERATION

(75) Inventors: Hans Viehmann, S. Burlington, VT (US); Heinz Hoenigschmid, Essex Junction, VT (US)

(73) Assignee: Infineon Technologies AG, Munich (DE)

( * ) Notice: Subject to any disclaimer, the term of this patent is extended or adjusted under 35 U.S.C. 154(b) by 137 days.

(21) Appl. No.: 10/079,774

(22) Filed: Feb. 19, 2002

(65) Prior Publication Data

US 2003/0156469 A1 Aug. 21, 2003

(51) Int. Cl.[7] .............................................. G11C 11/00
(52) U.S. Cl. ............... 365/230.06; 365/200; 365/225.7; 365/230.01; 365/171; 365/173
(58) Field of Search ........................... 365/230.06, 200, 365/225.7, 230.01, 171, 173

(56) References Cited

U.S. PATENT DOCUMENTS

| | | | | |
|---|---|---|---|---|
| 4,918,662 A | * | 4/1990 | Kondo | 365/210 |
| 5,243,570 A | * | 9/1993 | Saruwatari | 365/201 |
| 5,325,334 A | * | 6/1994 | Roh et al. | 365/201 |
| 5,771,195 A | * | 6/1998 | McClure | 365/200 |
| 6,084,807 A | * | 7/2000 | Choi | 365/200 |
| 6,144,592 A | * | 11/2000 | Kanda | 365/200 |
| 6,166,973 A | * | 12/2000 | Shinozaki | 365/200 |
| 6,567,300 B1 | * | 5/2003 | Raberg et al. | 365/173 |
| 6,611,466 B2 | * | 8/2003 | Lee et al. | 365/200 |
| 6,634,003 B1 | * | 10/2003 | Phan | 714/710 |
| 2002/0003747 A1 | * | 1/2002 | Yahata et al. | 365/233 |
| 2003/0115518 A1 | * | 6/2003 | Kleveland et al. | 714/718 |
| 2003/0164510 A1 | * | 9/2003 | Dono | 257/200 |

FOREIGN PATENT DOCUMENTS

| JP | 4101172296 A | * | 6/1998 | G11C/29/00 |
|---|---|---|---|---|
| JP | 410208495 | * | 8/1998 | G11C/29/00 |
| JP | 02001210091 | * | 8/2001 | G11C/29/00 |

* cited by examiner

Primary Examiner—Viet Q. Nguyen
(74) Attorney, Agent, or Firm—Slater & Matsil, L.L.P.

(57) ABSTRACT

It is difficult to fabricate a semiconductor memory device without any faulty memory storage cells. One solution is to produce more storage cells than needed on a device and faulty storage cells are replaced by the redundant storage cells. This solution requires that the addresses of the faulty storage cells, along with the replacement storage cells, be saved in a memory. The present invention teaches the use of non-volatile memory cells, particularly magnetoresistive random access memory (MRAM) cells, to store the addresses. Non-volatile memory cells can effectively replace the laser fuses currently used and also provides an advantage in the elimination of the laser fuse-burning step during the fabrication of the device.

31 Claims, 6 Drawing Sheets

FUSE CONCEPT AND METHOD OF OPERATION

FIELD OF THE INVENTION

This invention relates generally to integrated circuits, and particularly to the use of non-volatile memory cells as replacements for fuse elements in memory storage devices.

BACKGROUND OF THE INVENTION

As integrated circuits become more complex and densely populated, the probability of a failure or fault occurring in the integrated device increases, often simply due to the increase in the number of devices on the integrated circuit. This is a particular problem with memory storage devices such as dynamic random access memories (DRAM), static RAM (SRAM), magnetoresistive RAM (MRAM), etc. since memory storage devices tend to be extremely densely packed. A commonly used technique to deal with the increased probability of failures is to include redundant elements on the integrated circuit. For example, memory storage devices may contain additional segments and arrays of storage cells that can be used in place of the faulty segments and arrays.

One way to make use of the redundant memory segments and arrays is to use laser fuses to store the memory addresses of faulty memory storage cells. When the faulty memory storage cell is accessed, circuitry redirects the access to a redundant storage cell that is not faulty. However, the use of laser fuses requires an additional manufacturing step where memory storage cells in the memory storage device is scanned and faulty storage cells are marked and their locations written (blown) into the laser fuses. The additional manufacturing step adds cost, both in terms of time and money, to the storage device.

Additionally, because the laser fuses are written during the manufacturing process and prior to the packaging, the laser fuses cannot be updated after the integrated circuit is packaged. Therefore, should additional memory storage cells become defective during use, their addresses cannot be written (stored in the laser fuses) and redundant storage cells cannot take their place, making the memory storage device unusable.

A need has therefore arisen for a method and apparatus that can be used to store information regarding faulty memory storage cells that also provides for the ability to update the information regarding faulty memory storage cells after the storage device has been under use.

SUMMARY OF THE INVENTION

In one aspect, the present invention provides a semiconductor memory device comprising: a first memory for storing logical data values in storage cells, an address decoder coupled to the first memory, the address decoder containing circuitry to decode address bits provided to the memory device and to select a storage cell, a redundant controller coupled to the address decoder, the redundant controller comprising a second memory for storing a list of addresses of faulty memory storage cells and a redundant memory storage cell for each faulty memory storage cell, wherein the second memory comprising non-volatile memory cells, a redundant address decoder coupled to the redundant controller, the redundant address decoder containing circuitry to decode the address bits of the replacement memory storage cells to select a redundant memory storage cell in the redundant memory, and a redundant memory coupled to the redundant address decoder, the redundant memory containing redundant memory storage cells.

In another aspect, the present invention provides a method for providing fault tolerance in a semiconductor memory device comprising: testing memory storage cells for faults, determining faulty memory storage cells, saving faulty memory storage cells to non-volatile memory, and associating redundant memory storage cells to the faulty memory storage cells.

The present invention provides a number of advantages. For example, use of a preferred embodiment of the present invention allows the information stored in the non-volatile memory to be updated after the memory storage device has been packaged and is already in use. This also permits the addition of new faulty memory cell addresses to a list of faulty memory cell addresses and permit the continued use of the memory storage device that would have otherwise resulted in the memory storage device being discarded. This ability to update the list of faulty memory cell addresses allows the periodic check for new faulty memory cells and the addition of any new faulty memory cells to the list of faulty memory cells.

Additionally, use of a preferred embodiment of the present invention allows for greater information density when compared to the use of laser fuses to store information due to the smaller size of the non-volatile memory cells when compared to the laser fuses. The greater information density permits a smaller footprint required to save a same amount of address information.

Also, use of a preferred embodiment of the present invention saves on manufacturing cost because an additional step during the manufacturing process to burn the laser fuses is not required. In fact, the use of a preferred embodiment of the present invention permits the complete manufacture and packaging of the memory storage devices and then allows for the testing of the storage devices at a later time.

Also, use of a preferred embodiment of the present invention permits the choice of either the cross-point array architecture or the MRAM FET architecture, allowing the user to use whichever existing device architecture they are currently using and not requiring the change to any one particular device architecture.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

Figure 1:
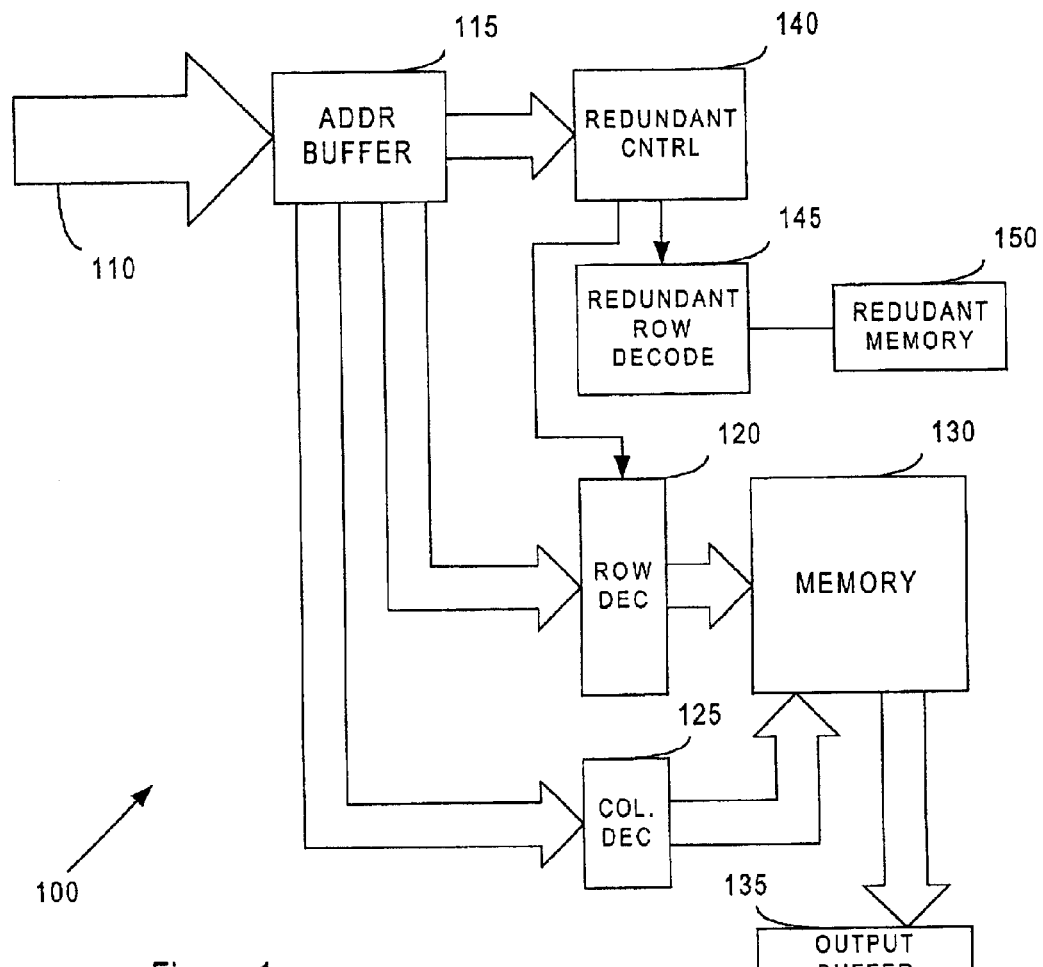
FIG. 1 illustrates a block diagram of a prior art semiconductor memory circuit featuring a redundant memory space and functional logic to support the replacement of faulty memory storage cells with memory storage cells from the redundant storage space.

The making and use of the various embodiments are discussed below in detail. However, it should be appreciated that the present invention provides many applicable inventive concepts, which can be embodied in a wide variety of specific contexts. The specific embodiments discussed are merely illustrative of specific ways to make and use the invention, and do not limit the scope of the invention.

Regardless of the how logical information is stored in the memory storage device, either via a voltage or via magnetism, they tend to be extremely densely populated. The dense population has permitted an ever increasing amount of information storage in a storage device that is constantly decreasing in size.

As the number of storage cells in a single storage device increases, the probability of a failure in one or more of the storage cells in the storage device also increases. With more and more storage cells in a single storage device, the probability of finding a storage device with no faulty storage cells asymptotically approaches zero. As a result, methods and apparatus have been developed to increase the yield on memory storage devices. One method is to include more memory storage cells than needed and then replacing faulty storage cells with the additional storage cells. While one talks of replacing a single faulty storage cell with another storage cell, it is common to replace an entire segment or array of storage cells that contains the faulty storage cell with another segment or array of storage cells.

Using the above method, the addresses of memory storage cells that are deemed to be faulty are saved and non-faulty memory storage cells from the additional set of memory storage cells, commonly referred to as the redundant memory, are used in their place. Whenever a faulty memory storage cell is accessed (either read or written), the address of the faulty memory storage cell is noted and the read or write access is redirected to the replacement memory storage cell.

The addresses of the faulty memory storage cells are typically maintained in a bank of fuses, either blown by laser or electrical current that is greater than current typically used during normal operation. The addresses of the faulty storage cells are determined usually after the memory storage device has been fabricated, when the storage device undergoes functional testing. This is typically done prior to placing the storage device in its final packaging. The functionality of each individual memory storage cell is tested and the addresses of faulty memory storage cells are written to the bank of fuses. Written alongside the addresses of the faulty storage cells are addresses of the replacement storage cells for each of the faulty storage cells. If the fuses are of the laser variety, then a laser is used to burn the fuses. If the fuses are blown via an electrical current, then a current of an appropriate value is used. After the testing is complete, then the memory storage device is packaged and typically, no further updates to the fuse bank is possible.

Referring now to FIG. 1, a diagram displays a prior art semiconductor memory circuit 100 featuring a redundant memory space and necessary functional logic to support the replacement of faulty memory storage cells with redundant memory storage cells from the redundant memory storage space. The semiconductor memory circuit 100 comprises an address buffer 115, a row decoder 120, a column decoder 125, a memory array 130, an output buffer 135, a redundancy controller 140, a redundant row decoder 145, and a redundant memory 150.

An n-bit memory address is applied to the address buffer 115 via an address bus 110. A portion of the n-bit address is applied to the row decoder 120 while the remainder is applied to the column decoder 125. The row decoder 120 and the column decoder 125 decode the address bits and designate row and column addresses in the memory array 130. The stored data value at the address specified is read out from the memory array 130 and is passed through to the output buffer 135. A similar operation is used for writing a data value to a specified memory address.

The redundancy controller 140 comprises a memory circuit (not shown) for storing addresses of faulty memory storage cells in the memory array 130, a comparing circuit (not shown) for comparing the input address and the address of the defective memory storage cell stored in the memory circuit, and a detecting circuit (not shown) for detecting states of fuses in the memory circuit. The comparing circuit is supplied with the address bits via the address buffer 115 and produces a disable signal for disabling the row decoder 120 and enabling the redundant row decoder 145 when the address from the address buffer 115 matches an address of a faulty memory storage cell stored in the memory circuit. Therefore, when the address designates a faulty memory storage cell, a memory storage cell from the redundant memory 150 is accessed in place of the faulty memory storage cell in the memory array 130.

The memory circuit from the redundancy controller 140 is used for storing the addresses of the faulty memory storage cells in the memory array 130. The memory circuit uses fuses to maintain the address information. During the testing phase of the manufacturing process for the memory storage device, faulty memory storage cells were detected and their addresses were stored in the memory circuit. As stated previously, the fuses in the memory circuit may be laser fuses that require a high-energy laser to blow or they may be electrical fuses that use a high current to blow.

A disadvantage of using fuses to store the memory addresses of faulty memory storage cells is that fuses are normally not updateable, meaning that should additional memory storage cells become faulty during normal use, the list of faulty memory storage cells cannot be brought up-to-date. This arises from the need of special equipment, such as lasers and large current sources that are coupled to the storage device, etc. that are needed to blow the fuses. Such equipment usually requires direct access to the fuses that they are attempting to blow. The direct access to the fuses is typically lost once the integrated circuit is placed into its packaging.

An alternative to the use of fuses to store the memory addresses of faulty memory storage cells would be non-volatile memory. Non-volatile memory, such as but not limited to: flash programmable memory, erasable programmable read-only memory (EPROM), electrically erasable programmable read-only memory (EEPROM), resistive memories, magnetoresistive random access memory (MRAM), etc. The use of nonvolatile memory rather than fuses can be readily integrated into existing memory storage devices. For example, a memory circuit, such as the memory circuit from the redundancy controller 140, comprising a block of non-volatile memory could be used in place of a memory circuit comprising a block of fuses. The discussion below involves MRAM memory devices, however, other types of non-volatile memory can be used in place of MRAM. Therefore, the present invention should not be construed as being limited to MRAM memory devices.

MRAM semiconductor memory devices uses spin electronics, which combines traditional semiconductor technology and magnetism. Rather than using an electrical charge to indicate the presence of a binary "1" or "0", the spin of an electron is used. An example of such a spin electronic device is a magnetoresitive random access memory (MRAM) storage device, which includes conductive lines positioned perpendicular to one another in different metal layers. The place where the conductive lines intersect is known as a cross-point. In between the perpendicular conductive lines is a magnetic stack. The magnetic stack is placed at the cross-point, sandwiched between the conductive lines.

An electrical current flowing through one of the conductive lines induces a magnetic field around the conductive line. The induced magnetic field can align (or orient) the alignment (or orientation) of magnetic dipoles in the magnetic stack. The right hand rule is a way to determine the direction of a magnetic field induced by a current flowing in a particular direction. The right hand rule is well understood by those of ordinary skill in the art of the present invention.

A different current flowing through the other conductive line induces another magnetic field and can realign the polarity of the magnetic field in the magnetic stack. Binary information, represented as a "0" or "1", is stored as different alignments of the magnetic dipoles in the magnetic stack. Currents flowing through both conductive lines are required to selectively program a particular magnetic stack.

The alignment of the magnetic dipoles in the magnetic stack changes the electrical resistance of the magnetic stack. For example, if a binary "0" is stored in the magnetic stack, the resistance of the magnetic stack will be different from the resistance of the same magnetic stack if a binary "1" is stored in the magnetic stack. It is the resistance of the magnetic stack that is detected and determines the logical value stored therein.

Figure 2A:
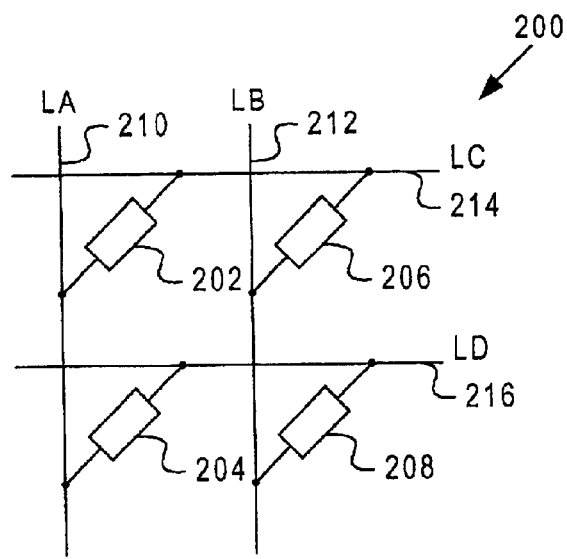
FIG. 2a illustrates a block diagram of four MRAM storage cells arranged in a bridge configuration arranged in a cross-point array architecture used for storing a binary value according to a preferred embodiment of the present invention.

Referring now to FIG. 2a, a diagram illustrates a configuration of MRAM memory storage cells 200 arranged in a cross-point array architecture used to store a single bit of information for use as a replacement for a fuse according to a preferred embodiment of the present invention. The configuration of MRAM memory storage cells 200 comprising four individual MRAM memory storage cells 202, 204, 206, and 208 arranged in a cross-point array architecture. The cross-point array architecture is one of several standard architectures used for arranging MRAM memory storage cells and is well understood by those of ordinary skill in the art of the present invention.

Each MRAM memory storage cell is coupled to two conductive lines, one at each end of the storage cell. For example, MRAM memory storage cell 202 is coupled to conductive line "LA" 210 at one end and conductive line "LC" 214 at another end. The four MRAM memory storage cells 202, 204, 206, and 208 are coupled to four conductive lines: "LA" 210, "LB" 212, "LC" 214, and "LD" 216. The conductive lines are used both to program the MRAM memory storage cells and read the values stored in the MRAM memory storage cells. The MRAM memory storage cells may also be written by applying a write voltage that results in the breaking of a tunneloxide layer (not shown) in the MRAM memory storage cell. This is commonly referred to as overdriving the voltage.

According to a preferred embodiment of the present invention, the MRAM memory storage cells are programmed in the following manner to represent one state: MRAM storage cell 202 is programmed to hold a binary value "0", MRAM storage cell 204 is programmed to hold a binary value "1", MRAM storage cell 206 is programmed to hold a binary value "1", and MRAM storage cell 208 is programmed to hold a binary value "0". To represent the alternative state, the MRAM memory storage cells are programmed in a complementary value: MRAM storage cell 202 holds "1", MRAM storage cell 204 holds "0", MRAM storage cell 206 holds "0", and MRAM storage cell 208 holds "1". The values programmed into the individual MRAM storage cells discussed above is a preferred set of values, however, other combinations of values are possible and are equally operative.

The particular arrangement of the MRAM memory storage cells in a cross-point array creates two voltage dividers when the read voltage is applied through conductive lines "LC" 214 and "LD" 216. This arrangement is commonly referred to as a bridge configuration. The bridge configuration is preferable due to higher signal values generated by the configuration. The values stored in the MRAM memory storage cells can be detected via a simple dynamic random access memory (DRAM) latch type sense amp. Sense amps are used to detect logical values stored in memory storage cells and are well understood by those of ordinary skill in the art of the present invention. According to a preferred embodiment of the present invention, the applied voltage used to detect the values stored in the MRAM storage cells is approximately equal to twice the breakdown voltage of a single MRAM cell.

The cross-point array architecture, as discussed in FIG. 2a, is one of two widely used architectures for MRAM memory devices. The second architecture is commonly referred to as the MRAM FET (field effect transistor) architecture. The MRAM FET architecture is similar to the cross-point array architecture with the exception of a FET present between the MRAM storage cell and the second conductive line used to control the FET. The FET is preferably an n-type FET. Therefore, the basic MRAM FET unit comprises a first conductive line coupled to a MRAM storage cell coupled to a FET coupled to a second conductive line and a voltage supply.

Figure 2B:
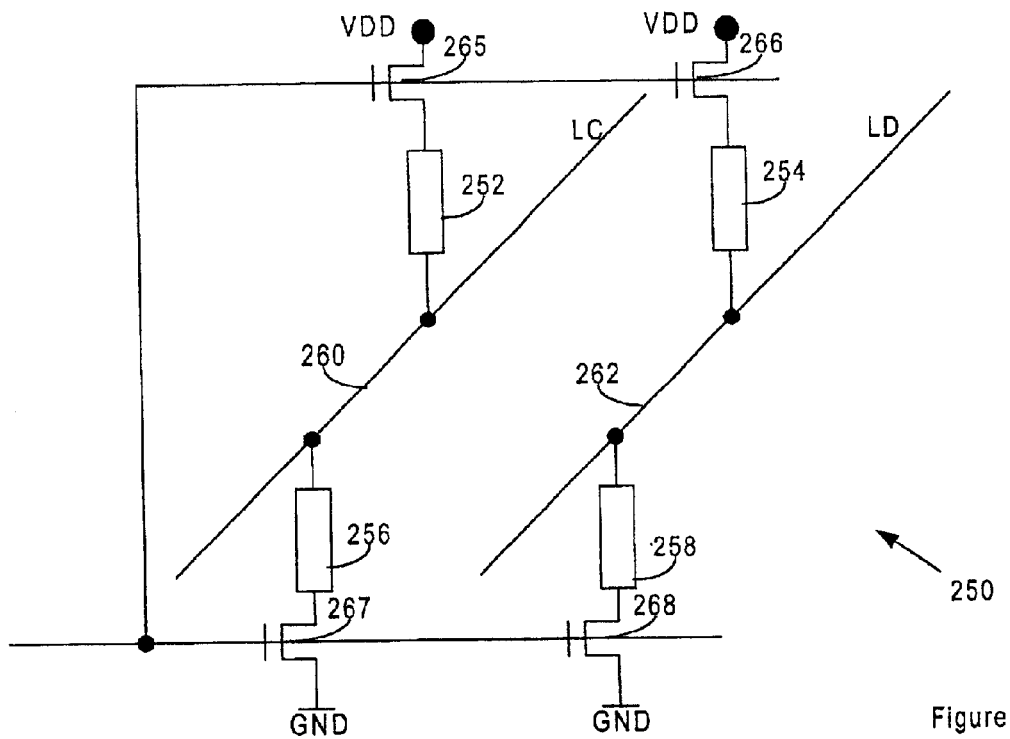
FIG. 2b illustrates a block diagram of four MRAM storage cells arranged in a bridge configuration arranged in a MRAM FET architecture used for storing a binary value according to a preferred embodiment of the present invention.

Referring now to FIG. 2b, a diagram illustrates a configuration of MRAM memory storage cells 250 arranged in a MRAM FET architecture used to store a single bit of information for use as a replacement for a fuse according to a preferred embodiment of the present invention. The configuration of MRAM memory storage cells 250 comprising four individual MRAM memory storage cells 252, 254, 256, and 258 arranged in a MRAM FET architecture. Each MRAM memory storage cell coupled to a single conductive line and a FET, the conductive line at one end of the memory storage cell and the FET at the other. For example, MRAM memory storage cell 252 is coupled to conductive line "LC" 260 at one end and FET 265. The FET 265 is in turn coupled to a second conductive line. The FET 265 is also coupled to "VDD", the voltage supply for the architecture. With the exception of the FETs, the MRAM FET arrangement of the present invention is similar to the cross-point array arrangement.

Figure 3:
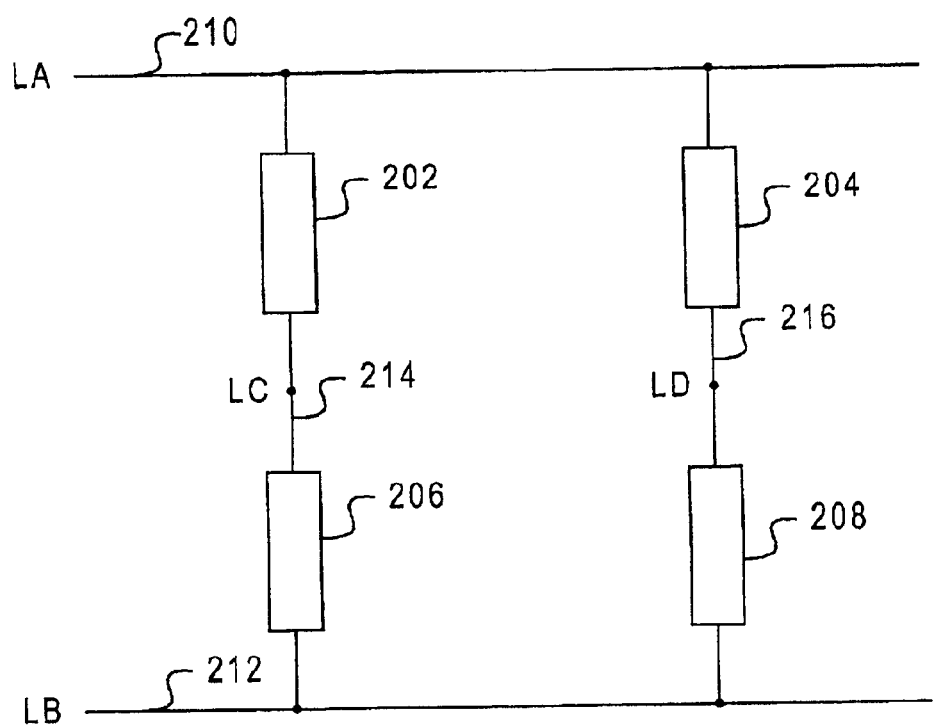
FIG. 3 illustrates a block diagram of the four MRAM storage cells from FIG. 2 displayed as two voltage dividers according to a preferred embodiment of the present invention.

Referring now to FIG. 3, a diagram illustrates the two voltage dividers created from the arrangement of MRAM memory storage cells when read voltages are applied through conductive lines "LC" 214 and "LD" 216 according to a preferred embodiment of the present invention. Notice that the actual arrangement of the MRAM memory storage cells does not change when the read voltages are applied and that the diagram of FIG. 3 is a logical re-arrangement of the MRAM memory storage cells to make the voltage dividers easier to see and analyze.

According to a preferred embodiment of the present invention, a read voltage of approximate two times the quiescent voltage (2*Veq) is applied to conductive line "LC" 214 and a ground voltage is applied to conductive line "LD" 216. This voltage drop creates two voltage dividers and the conductive lines "LA" 210 and "LB" 212 can be used to read the values stored in the MRAM memory storage cells.

According to a preferred embodiment of the present invention, a voltage can be detected at the sense amps. The voltage is proportional to the change of resistance, k, in the MRAM memory storage cells. As discussed previously, the resistance of MRAM memory storage cells changes depending on the alignment of their magnetic dipoles. The voltage at the sense amp can be expressed as: $Vsig=2*Veq*k/(2+k)$, where Veq is the quiescent voltage and k is the change in resistance of the MRAM memory storage cell.

The use of four MRAM memory storage cells to represent the state of a single fuse is a preferred number of storage cells because the use of four storage cells provides a greater read voltage margin, i.e., Vsig strength, to be used when detecting the data represented by the arrangement when compared with arrangements using less than four storage cells. Arrangements with greater than four storage cells are also possible, but their use does not significantly increase the read voltage margin and their larger size reduces the size efficiency gained by using non-volatile memory as opposed to fuses. However, arrangements with the number of MRAM memory storage cells other than four are possible.

Figure 4A:
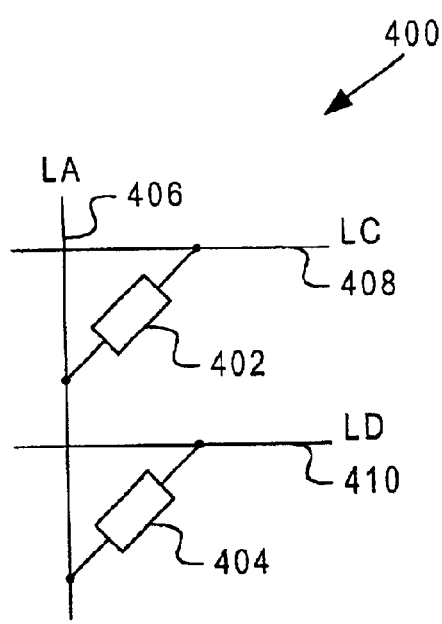
FIGS. 4a–b illustrate block diagrams of two and one MRAM storage cells arranged in a bridge fashion arranged in a cross-point array architecture for use in storing a binary value according to a preferred embodiment of the present invention.

Referring now to FIG. 4a, a diagram illustrating a configuration of MRAM memory storage cells 400 arranged in a cross-point array architecture used to store a single bit of information for use as a replacement for a fuse according to a preferred embodiment of the present invention. The configuration of MRAM memory storage cells 400 comprising two individual MRAM memory storage cells 402 and 404 arranged in a cross-point array architecture with three conductive lines "LA" 406, "LC" 408, and "LD" 410. Notice that this configuration 400 is essentially one-half of the configuration 200 discussed in FIG. 2.

According to a preferred embodiment of the present invention, to represent one possible fuse state, MRAM storage cell 402 is programmed to hold value "0" while MRAM storage cell 404 is programmed to hold value "1". To represent the other possible fuse state, MRAM storage cell 402 holds "1" while MRAM storage cell 404 holds "0". The values programmed into the individual MRAM storage cells discussed above is a preferred set of values, however, other combinations of values are possible and are equally operative.

The particular arrangement of the MRAM memory storage cells in a cross-point array creates a voltage divider when the read voltage is applied through conductive lines "LC" 408 and "LD" 410. The values stored in the MRAM memory storage cells can be detected via a simple dynamic random access memory (DRAM) latch type sense amp. Alternatively, additional MRAM cells can be used as reference cells (elements) in conjunction with the MRAM cells 402 and 404 to construct a bridge configuration as discussed above. The reference cells would not be used to actually store data, but only in the construction of the bridge.

Figure 4B:
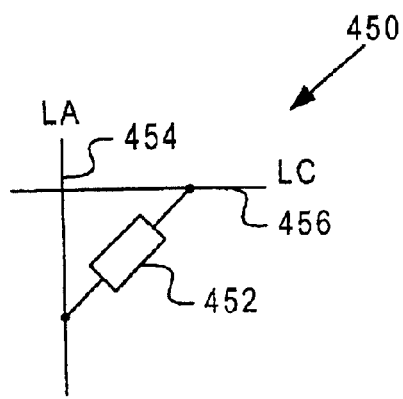

Referring now to FIG. 4b, a diagram illustrating a configuration of a single MRAM memory storage cell 450 arranged in a cross-point array architecture used to store a single bit of information for use as a replacement for a fuse according to a preferred embodiment of the present invention. The configuration of a single MRAM memory storage cell 450 comprising an individual MRAM memory storage cell 452 with two conductive lines "LA" 454 and "LC" 456. Notice that this configuration 450 is essentially one-half of the configuration 400 discussed in FIG. 4a.

According to a preferred embodiment of the present invention, to represent one possible fuse state, MRAM storage cell 452 is programmed to hold value "0". To represent the other possible fuse state, MRAM storage cell 452 holds "1". The values programmed into the individual MRAM storage cells discussed above is a preferred set of values, however, it is possible to reverse the values used to represent the fuse states and the invention would be equally operative. The value stored in the MRAM cell 452 can be detected using standard techniques for detecting values stored in MRAM cells when they are used as normal memory cells. Alternatively, additional MRAM cells can be used as reference cells (elements) in conjunction with the MRAM cell 452 to construct a bridge configuration as discussed above. The reference cells would not be used to actually store data, but only in the construction of the bridge.

Figure 4C:
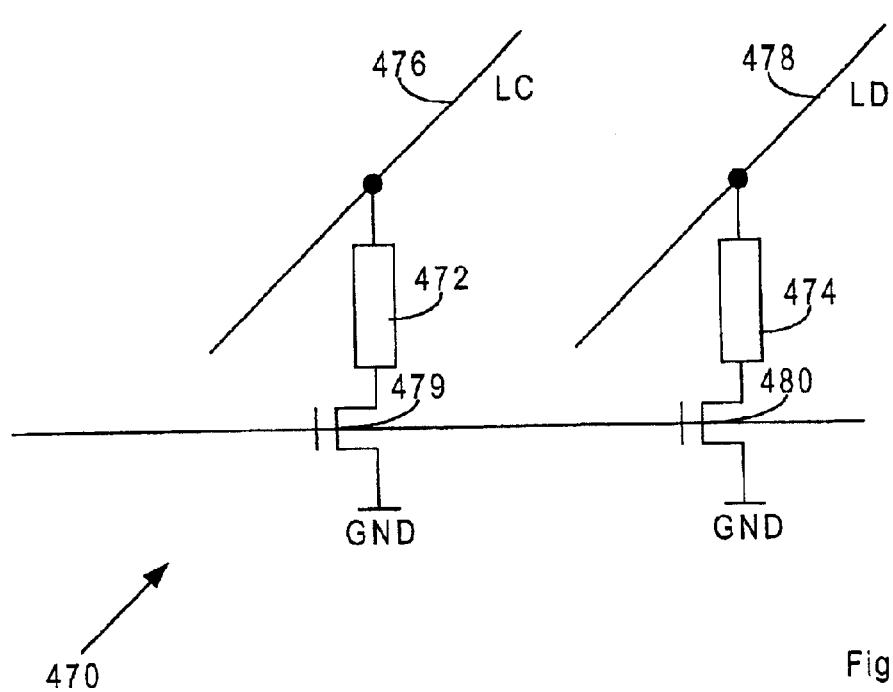
FIGS. 4c–d illustrate block diagrams of two and one MRAM storage cells arranged in a bridge fashion arranged in a MRAM FET architecture for use in storing a binary value according to a preferred embodiment of the present invention.
Figure 4D:
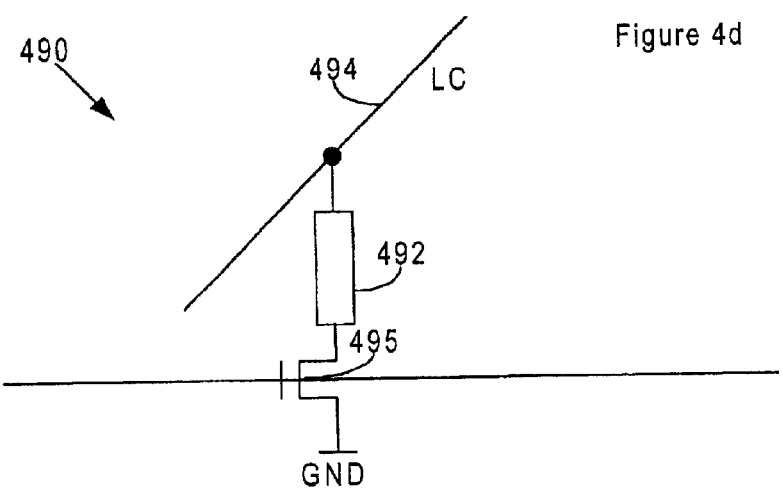

Referring now to FIGS. 4c and 4d, diagrams illustrate configurations of two MRAM memory storage cells 470 and one MRAM memory storage cell 490 arranged in a MRAM FET architecture used to store a single bit of information for use as a replacement for a fuse according to a preferred embodiment of the present invention. FIGS. 4c and 4d are similar to FIGS. 4a and 4b, respectively, and present essentially the same circuit using the MRAM FET architecture rather than the cross-point array architecture.

The non-volatile memory cells used to replace the fuses are themselves memory storage cells, like the remainder of the memory in the memory storage device. Therefore, they too can be faulty. As a result, to enable the detection of faults in the non-volatile memory cells, the non-volatile memory cells can be protected by an error-detecting code or an error-correcting code. An error-detecting code can detect the presence of an error, while an error-correcting code can both detect and correct errors (within set limits). If an error-correcting code is used, then as long as the number of faulty bits does not exceed the number of correctable errors, the use of the faulty block of non-volatile memory can continue. Error-detecting and error-correcting codes are well understood by those of ordinary skill in the art of the present invention.

Figure 5:
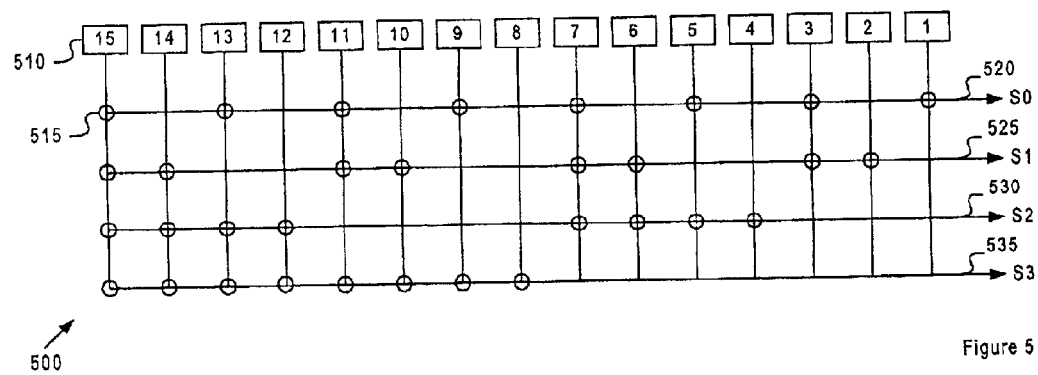
FIG. 5 illustrates an error-encoding code array used in protecting a group of data bits stored in a non-volatile memory according to a preferred embodiment of the present invention.

Referring now to FIG. 5, a diagram illustrates an error-correcting code array 500 used in protecting a group of data bits stored in a non-volatile memory according to a preferred embodiment of the present invention. According to a preferred embodiment of the present invention, the preferred error-correcting code is known as the Hamming code. However, there are many other error-correcting codes that may be used in place of the Hamming code, and any of them can be used without loss of any functionality in the present invention.

The circuit 500 displays an implementation of a Hamming code (15, 11). This means that 15 encoded bits are used to protect 11 data bits. This implies that 11 data bits, when encoded, turns into 15 encoded bits. The four additional bits provide the necessary encoding information to protect the 11 data bits. According to a preferred embodiment of the present invention, each of the 15 encoded bits is stored in a configuration of MRAM memory storage cells similar to the structures discussed in FIGS. 2, 4a, and 4b. For example, encoded bit number 15 would be stored in a structure 510 with the remaining 14 encoded bits being stored in the remaining structures.

A series of exclusive-or (XOR) blocks, for example, XOR block 515, implement a decoding operation used to test the encoded bits. The particular arrangement of the XOR blocks is dependent on the particular Hamming code used and the arrangement displayed in FIG. 5 is specifically for the Hamming code (15, 11). A series of result bits S0 520, S1 525, S2 530, and S3 535 provide the results of the decoding operation. If all of the result bits are zero, then none of the encoded bits are faulty. If one or more of the result bits are one, then one or more of the encoded bits are faulty. The actual decoding operation and determining which encoded bit(s) is faulty is beyond the scope of the present invention.

Since the addresses of the faulty memory cells are stored in non-volatile memory, the additional step of testing and burning the faulty memory cell addresses into fuses incurred during manufacturing is not necessary. According to a preferred embodiment of the present invention, it is possible to perform a test of all memory storage cells at regular intervals or at each system power-up to locate and mark faulty memory storage cells. When a new faulty memory storage cell is detected, the address of the memory storage cell can be stored in the non-volatile memory. An advantage provided in using this technique is that as memory storage cells becomes defective over time, the faulty memory storage cells can be replace with redundant memory storage cells rather than requiring the replacement of the entire memory storage device.

Figure 6:
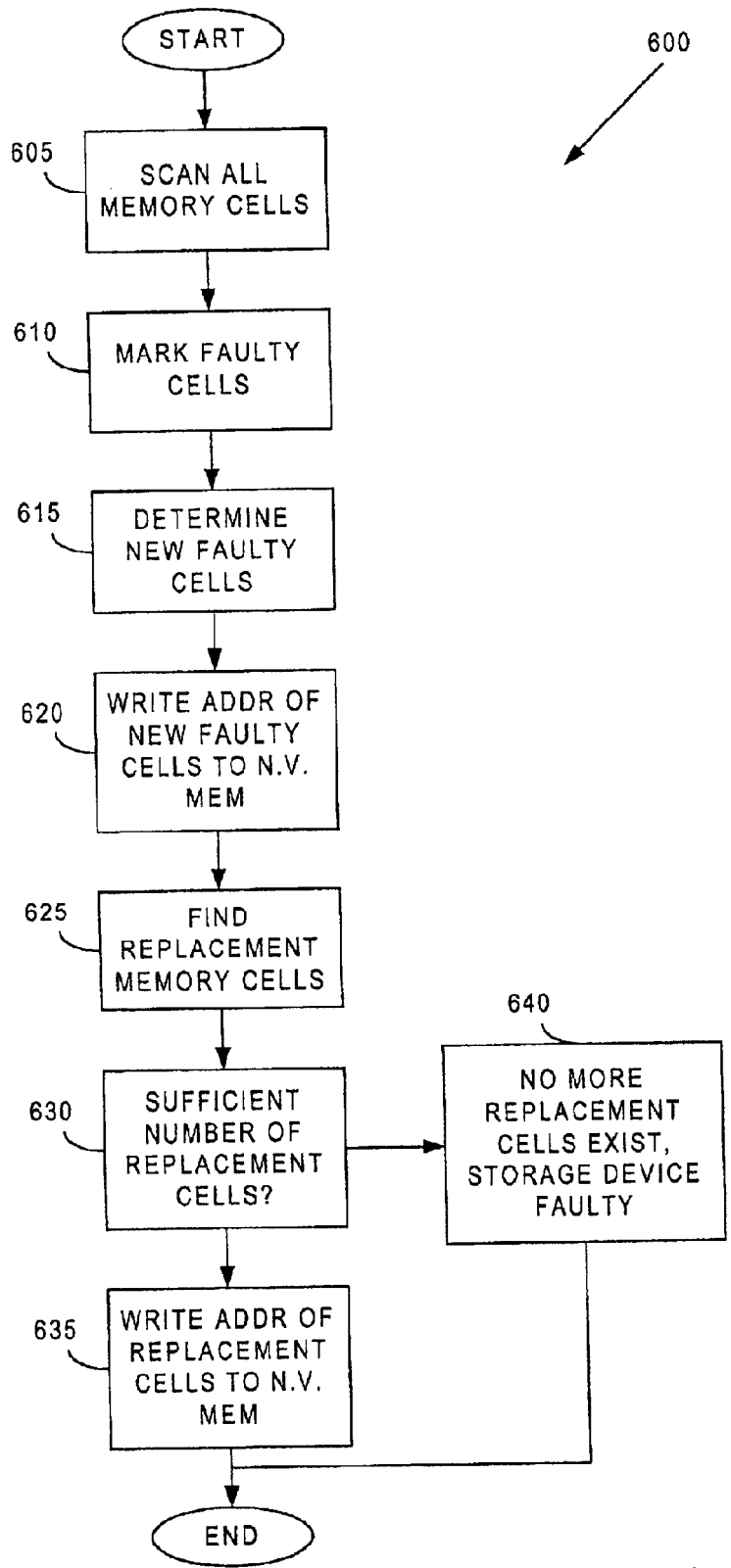
FIG. 6 illustrates an algorithm for determining faulty memory cells and adding their addresses to a non-volatile memory according to a preferred embodiment of the present invention.

Referring now to FIG. 6, a flow diagram illustrates an algorithm 600 for detecting faulty memory cells and updating the list of faulty memory cells according to a preferred embodiment of the present invention. According to a preferred embodiment of the present invention, the algorithm 600 executes on a processing element of the electronic device containing the memory storage device. The electronic device could be configured to execute the algorithm 600 periodically, after a prespecified number of hours of operation, or a certain number of power cycles, etc.

The electronic device begins by performing a scan of all memory cells in the memory storage device (block 605). There are many possible ways of testing memory cells: including writing specific values to each memory cell and reading the value back and comparing the results, the walking one test, the walking zero test, etc. After scanning all memory cells, the faulty cells are marked (block 610) and the faulty cells are compared against the list of faulty cells already present in the storage device (block 615).

If there are any new faulty cells, the address of the new faulty cells are added to the list of faulty cells stored in the non-volatile memory (block 620). After the new faulty cells are added to the list of faulty cells, replacement cells must be found (block 625). Part of this process involves the checking of the replacement memory to determine if any unallocated replacement memory exists (block 630). If sufficient replacement memory exists, then the replacement memory is allocated to the new faulty cells and the address of the replacement memory cells are stored in the list of faulty cells (block 635). If no more replacement memory cells exist, then the faulty cells cannot be replaced and the memory storage device is deemed faulty (block 640) and replacement is required if the electronic device is to be used.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor memory device comprising:
a first memory for storing logical data values in storage cells;
an address decoder coupled to the first memory, the address decoder containing circuitry to decode address bits provided to the memory device and to select a storage cell;
a redundant controller coupled to the address decoder, the redundant controller comprising a second memory for storing a list of addresses of faulty memory storage cells wherein the second memory comprises nonvolatile, resistive memory cells;
a redundant memory containing redundant memory storage cells; and
a redundant address decoder coupled to the redundant controller and the redundant memory, the redundant address decoder containing circuitry to decode the address bits to select a redundant memory storage cell in the redundant memory.

2. The semiconductor memory device of claim 1, wherein the redundant controller further comprises a comparator to compare the address bits against the list of addresses of faulty memory storage cells.

3. The semiconductor memory device of claim 1, wherein when a match between the address bits and an address of a faulty memory cell in the list occurs, then the redundant controller disables the address decoder and enables the redundant address decoder.

4. The semiconductor memory device of claim 3, wherein the redundant memory storage cell is used in place of the faulty storage cell when the match exists.

5. The semiconductor memory device of claim 1, wherein the redundant memory storage cell comprises a single individual storage cell.

6. The semiconductor memory device of claim 1, wherein the redundant memory storage cell comprises a plurality of individual storage cells and the plurality of storage cells are used to store the data of the faulty memory cell.

7. The semiconductor memory device of claim 1, wherein the redundant memory and the first memory are made of the same type of memory cells.

8. The semiconductor memory device of claim 1, wherein the redundant memory and the first memory are made of different types of memory cells.

9. The semiconductor memory device of claim 1, wherein the resistive memory cells are magnetoresistive random access memory (MRAM) cells.

10. The semiconductor memory device of claim 9, wherein a latch-type sense amp is used to retrieve information stored in the MRAM cells.

11. The semiconductor memory device of claim 9, wherein the applied voltage used to retrieve information stored in the MRAM cells is approximately equal to twice the breakdown voltage of a single MRAM cell.

12. The semiconductor memory device of claim 9, wherein the MRAM cells are laid out in a cross-point my architecture.

13. The semiconductor memory device of claim 9, wherein the MRAM cells are laid out in a MRAM FET architecture.

14. The semiconductor memory device of claim 9, wherein the voltage used to write information stored in the MRAM cells is sufficient to break through the MRAM cells' tunnel oxide layer.

15. The semiconductor memory device of claim 9, wherein the MRAM cells are implemented in a bridge configuration.

16. The semiconductor memory device of claim 15, wherein the bridge configuration comprises one MRAM cell.

17. The semiconductor memory device of claim 16, wherein the bridge configuration comprises two individual MRAM cells.

18. The semiconductor memory device of claim 17, wherein the bridge configuration comprises four individual MRAM cells.

19. The semiconductor memory device of claim 1, wherein each address stored in the list is encoded using an error-correcting code.

20. The semiconductor memory device of claim 19, wherein the error-correcting code is a Hamming code.

21. The semiconductor memory device of claim 1, wherein the nonvolatile memory cells can be programmed during normal operation of the semiconductor memory device.

22. A circuit comprising a semiconductor memory device as specified in claim 1.

23. An electronic device comprising a semiconductor memory device as specified in claim 1.

24. The semiconductor memory device of claim 1 wherein the second memory stores a list of addresses of faulty memory storage cells along with a corresponding redundant memory storage cell that is to replace each faulty memory cell.

25. The semiconductor memory device of claim 24, wherein the list stores the addresses of an entire segment of storage cells containing a faulty storage cell and an entire segment of replacement storage cells for each faulty segment.

26. A semiconductor memory device comprising:
   a first memory for storing logical data values in storage cells;
   an address decoder coupled to the first memory, the address decoder containing circuitry to decode address bits provided to the memory device and to select a storage cell;
   a redundant controller coupled to the address decoder, the redundant controller comprising a second memory for storing a list of addresses of faulty memory storage cells and a redundant memory storage cell for each faulty memory storage cell, wherein the second memory comprises magnetoresistive random access memory (MRAM) cells and wherein the MRAM cells are implemented in a bridge configuration;
   a redundant address decoder coupled to the redundant controller, the redundant address decoder containing circuitry to decode the address bits of the replacement memory storage cells to select a redundant memory storage cell in the redundant memory; and
   a redundant memory coupled to the redundant address decoder, the redundant memory containing redundant memory storage cells.

27. The semiconductor memory device of claim 26, wherein the bridge configuration comprises one MRAM cell.

28. The semiconductor memory device of claim 27, wherein the bridge configuration comprises two individual MRAM cells.

29. The semiconductor memory device of claim 28, wherein the bridge configuration comprises four individual MRAM cells.

30. A semiconductor memory device comprising:
   a first memory for storing logical data values in storage cells;
   an address decoder coupled to the first memory, the address decoder containing circuitry to decode address bits provided to the memory device and to select a storage cell;
   a redundant controller coupled to the address decoder, the redundant controller comprising a second memory for storing a list of addresses of faulty memory storage cells and a redundant memory storage cell for each faulty memory storage cell, wherein the second memory comprises non-volatile, resistive memory cells, and wherein each address stored in the list is encoded using an error-correcting code;
   a redundant address decoder coupled to the redundant controller, the redundant address decoder containing circuitry to decode the address bits of the replacement memory storage cells to select a redundant memory storage cell in the redundant memory; and
   a redundant memory coupled to the redundant address decoder, the redundant memory containing redundant memory storage cells.

31. The semiconductor memory device of claim 30, wherein the error-correcting code is a Hamming code.

* * * * *

UNITED STATES PATENT AND TRADEMARK OFFICE
CERTIFICATE OF CORRECTION

| | |
|---|---|
| PATENT NO. | : 6,801,471 B2 |
| DATED | : October 5, 2004 |
| INVENTOR(S) | : Viehmann et al. |

It is certified that error appears in the above-identified patent and that said Letters Patent is hereby corrected as shown below:

<u>Column 11,</u>
Line 9, "my" should read -- array --.

Signed and Sealed this

Nineteenth Day of April, 2005

JON W. DUDAS
*Director of the United States Patent and Trademark Office*